(12) United States Patent
Wu et al.

(10) Patent No.: US 8,674,376 B2
(45) Date of Patent: Mar. 18, 2014

(54) LED PACKAGE STRUCTURE

(75) Inventors: Chao-Chin Wu, Taipei (TW); Shen-Ta Yang, Taipei (TW)

(73) Assignee: Paragon Semiconductor Lighting Technology Co., Ltd., Taoyuan County (TW)

( * ) Notice: Subject to any disclaimer, the term of this patent is extended or adjusted under 35 U.S.C. 154(b) by 334 days.

(21) Appl. No.: 13/096,761

(22) Filed: Apr. 28, 2011

(65) Prior Publication Data

US 2012/0273806 A1 Nov. 1, 2012

(51) Int. Cl.
*H01L 29/18* (2006.01)
(52) U.S. Cl.
USPC ............. 257/88; 257/98; 257/99; 257/E27.12
(58) Field of Classification Search
USPC ......... 257/79, 98, 99, 100, 793, 88, 678, 690, 257/734, 784, 788, E27.12, E33.059, 257/E33.061, E33.067, 91, E21.001, 257/E21.088, E33.055, E33.056
See application file for complete search history.

(56) References Cited

U.S. PATENT DOCUMENTS

2011/0089441 A1* 4/2011 Wu ................................ 257/91

* cited by examiner

*Primary Examiner* — Selim Ahmed
(74) *Attorney, Agent, or Firm* — Li & Cai Intellectual Property (USA) Office

(57) ABSTRACT

An LED package structure with standby bonding pads for increasing wire-bonding yield includes a substrate unit, a light-emitting unit, a conductive wire unit and a package unit. The substrate unit has a substrate body and a plurality of positive pads and negative pads. The light-emitting unit has a plurality of LED bare chips. The positive electrode of each LED bare chip corresponds to at least two of the positive pads, and the negative electrode of each LED bare chip corresponds to at least two of the negative pads. Each wire is electrically connected between the positive electrode of the LED bare chip and one of the at least two positive pads or between the negative electrode of the LED bare chip and one of the at least two negative pads. The package unit has a light-permitting package resin body on the substrate body to cover the LED bare chips.

6 Claims, 6 Drawing Sheets

US 8,674,376 B2

LED PACKAGE STRUCTURE

BACKGROUND OF THE INVENTION

1. Field of the Invention

The instant disclosure relates to an LED package structure, and more particularly, to an LED package structure having a plurality of standby bonding pads for increasing wire-bonding yield.

2. Description of Related Art

Referring to FIG. 1, the LED package structure of the related art includes a plurality of LED bare chips 20. The positive electrode (not shown) and the negative electrode (not shown) of each LED bare chip 20 respectively correspond to one positive pad P and one negative pad N. Hence, when one end of a wire W does not correctly connect with the positive pad P or the negative pad N (it means that the wire W does not electrically connect with the positive pad P or the negative pad N (such as floating solder)), the manufacturer firstly needs to clean solder splash on the surface of the positive pad P or the negative pad N, and then making the same end of the wire W bond on the clean surface of the positive pad P or the negative pad N again. Therefore, the related art increases wire-bonding time (decreases wire-bonding efficiency) and decreases wire-bonding yield.

SUMMARY OF THE INVENTION

One particular aspect of the instant disclosure is to provide an LED package structure with standby bonding pads for increasing wire-bonding yield. The positive electrode and the negative electrode of each LED bare chip respectively correspond to at least two of the positive pads and at least two of the negative pads, so that the positive electrode of each LED bare chip has at least one standby positive pad and the negative electrode of each LED bare chip has at least one standby negative pad, in order to decrease wire-bonding time (increase wire-bonding efficiency) and increase wire-bonding yield.

One of the embodiments of the instant disclosure provides an LED package structure, including: a substrate unit, a light-emitting unit, a conductive wire unit and a package unit. The substrate unit has a substrate body and a plurality of positive pads and negative pads disposed on the top surface of the substrate body. The light-emitting unit has a plurality of LED bare chips electrically disposed on the top surface of the substrate body. Each LED bare chip has a positive electrode and a negative electrode, the positive electrode of each LED bare chip corresponds to at least two of the positive pads, and the negative electrode of each LED bare chip corresponds to at least two of the negative pads. The conductive wire unit has a plurality of wires. Every two wires are respectively electrically connected between the positive electrode of each LED bare chip and one of the at least two positive pads and between the negative electrode of each LED bare chip and one of the at least two negative pads. The package unit has a light-permitting package resin body disposed on the top surface of the substrate body to cover the LED bare chips.

One of the embodiments of the instant disclosure provides an LED package structure, including: a substrate unit, a light-emitting unit, a conductive wire unit and a package unit. The substrate unit has a substrate body and a plurality of first pads and second pads disposed on the top surface of the substrate body. The light-emitting unit has a plurality of LED bare chips electrically disposed on the top surface of the substrate body. Each LED bare chip has two electrodes, one of the two electrodes of each LED bare chip corresponds to at least two of the first pads, and another one of the two electrodes of each LED bare chip is electrically contacted with each second pad. The conductive wire unit has a plurality of wires. Each wire is electrically connected between one of the two electrodes of each LED bare chip and one of the two first pads. The package unit has a light-permitting package resin body disposed on the top surface of the substrate body to cover the LED bare chips.

Therefore, when a first end of the wire does not correctly connect with first one of the at least two positive pads or the at least two negative pads (it means that the wire does not electrically connect with the first one of the at least two positive pads or the at least two negative pads (such as floating solder)), the manufacturer can make the same first end of the wire connect to another one of the at least two positive pads or the at least two negative pads without cleaning solder splash on the surface of the first one of the at least two positive pads or the at least two negative pads, in order to decrease wire-bonding time (increase wire-bonding efficiency) and increase wire-bonding yield.

To further understand the techniques, means and effects the instant disclosure takes for achieving the prescribed objectives, the following detailed descriptions and appended drawings are hereby referred, such that, through which, the purposes, features and aspects of the instant disclosure can be thoroughly and concretely appreciated. However, the appended drawings are provided solely for reference and illustration, without any intention that they be used for limiting the instant disclosure.

DETAILED DESCRIPTION OF THE PREFERRED EMBODIMENTS

First Embodiment

Figure 1:
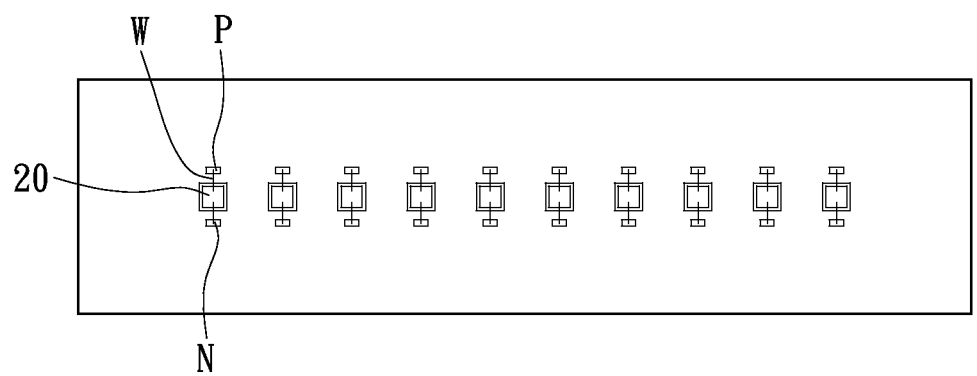
FIG. 1 is a top, schematic view of the LED package structure according to the related art.
Figure 2A:
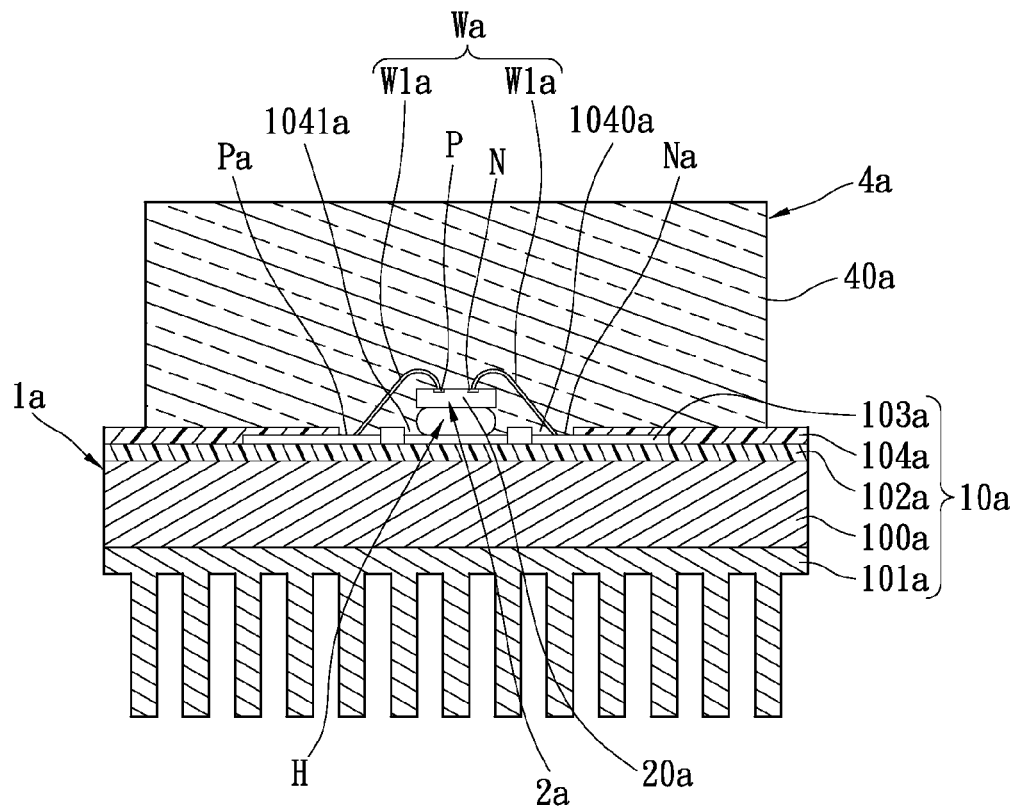
FIG. 2A is a cross-sectional, schematic view of the LED package structure according to the first embodiment of the instant disclosure.
Figure 2B:
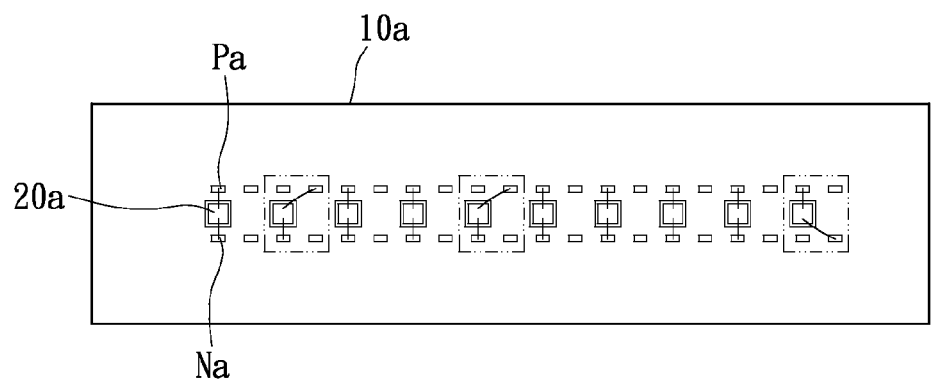
FIG. 2B is a top, schematic view of the LED package structure according to the first embodiment of the instant disclosure (the package unit has been removed)

Referring to FIGS. 2A and 2B, the first embodiment of the instant disclosure provides an LED package structure with standby bonding pads for increasing wire-bonding yield, including: a substrate unit 1a, a light-emitting unit 2a, a conductive wire unit Wa and a package unit 4a.

The substrate unit 1a has a substrate body 10a and a plurality of positive pads Pa and negative pads Na disposed on the top surface of the substrate body 10a. Furthermore, the substrate body 10a has a heat-dissipating substrate 100a, a heat sink 101a disposed on a bottom surface of the heat-dissipating substrate 100a (the heat sink 101a is composed of a plurality of heat-dissipating fins), a first insulating layer 102a disposed on the top surface of the heat-dissipating substrate 100a, at least two conductive layers 103a separated from each other and disposed on the first insulating layer 102a, and a second insulating layer 104a with a plurality of pad openings 1040a and bare chip openings 1041a for covering the at least two conductive layers 103a. The positive pads Pa disposed on one of the conductive layers 103a and the negative pads Na disposed on the other conductive layer 103a are respectively exposed by the pad openings 1040a of the second insulating layer 104a.

Moreover, the light-emitting unit 2a has a plurality of LED bare chips 20a electrically disposed on the top surface of the substrate body 10a. Each LED bare chip 20a has a positive electrode P and a negative electrode N. The positive electrode P of each LED bare chip 20a corresponds to at least two of the positive pads Pa, and the negative electrode N of each LED bare chip 20a corresponds to at least two of the negative pads Na (as shown in the phantom lines of FIG. 2B). In other words, the positive electrode P of each LED bare chip 20a can selectively electrically connected to one of the at least two positive pads Pa (as shown in the first and the second phantom lines of FIG. 2B), and the negative electrode N of each LED bare chip 20a can selectively electrically connected to one of the at least two negative pads Na (as shown in the third phantom lines of FIG. 2B). In addition, each LED bare chip 20a is disposed in or above each bare chip opening 1041a and on the first insulating layer 102a by an adhesive layer H.

Furthermore, the conductive wire unit Wa has a plurality of wires W1a. Every two wires W1a are respectively electrically connected between the positive electrode P of each LED bare chip 20a and one of the at least two positive pads Pa (another positive pad Pa as a standby bonding pad that does not be touched by the wire W1a) and between the negative electrode N of each LED bare chip 20a and one of the at least two negative pads Na (another negative pad Na as a standby bonding pad that does not be touched by the wire W1a). In other words, one end of each wire W1a is electrically connected to the positive electrode P or the negative electrode N of each LED bare chip 20a, and another end of each wire W1a is electrically connected to one of the at least two positive pads Pa or one of the at least two negative pads Na.

Hence, when a first end of the wire W1a does not correctly connect with first one of the at least two positive pads Pa or the at least two negative pads Na (it means that the wire W1a does not electrically connect with the first one of the at least two positive pads Pa or the at least two negative pads Na (such as floating solder)), the manufacturer can make the same first end of the wire W1a connect to another one of the at least two positive pads Pa or the at least two negative pads Na without cleaning solder splash on the surface of the first one of the at least two positive pads Pa or the at least two negative pads Na, in order to decrease wire-bonding time (increase wire-bonding efficiency) and increase wire-bonding yield.

Furthermore, the package unit 4a has a light-permitting package resin body 40a disposed on the top surface of the substrate body 10a to cover the LED bare chips 20a. The light-permitting package resin body 40a can be a transparent resin or a resin mixed with phosphor powders.

Second Embodiment

Figure 3:
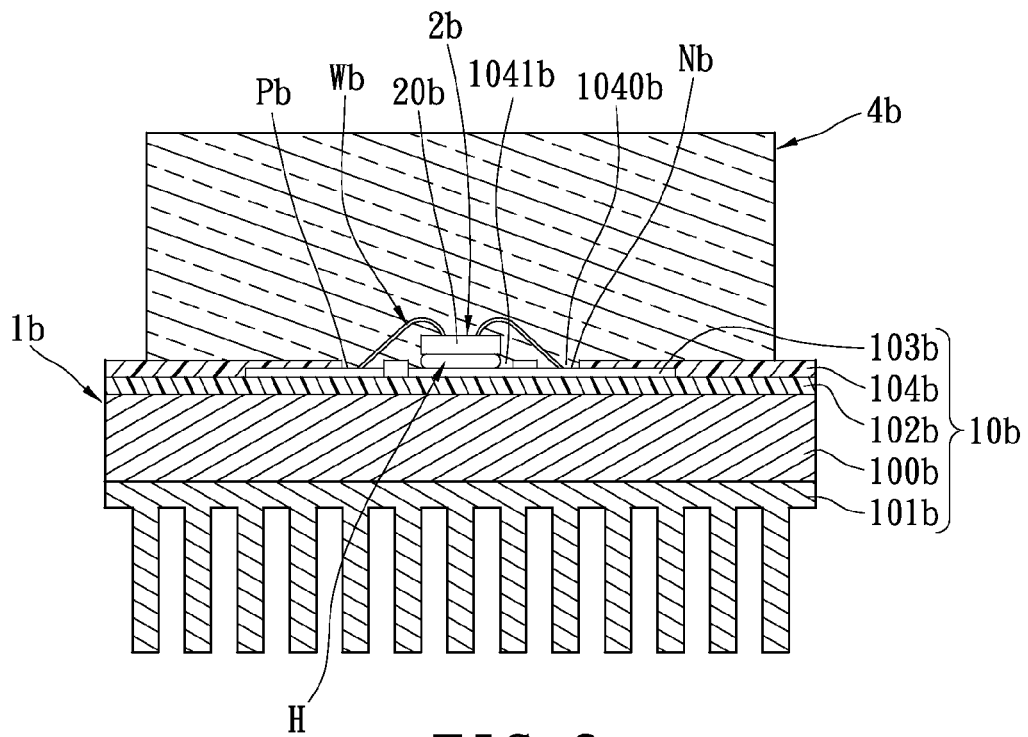
FIG. 3 is a cross-sectional, schematic view of the LED package structure according to the second embodiment of the instant disclosure.

Referring to FIG. 3, the second embodiment of the instant disclosure provides an LED package structure with standby bonding pads for increasing wire-bonding yield, including: a substrate unit 1b, a light-emitting unit 2b, a conductive wire unit Wb and a package unit 4b. Moreover, the substrate body 10b has a heat-dissipating substrate 100b, a heat sink 101b disposed on a bottom surface of the heat-dissipating substrate 100b, a first insulating layer 102b disposed on the top surface of the heat-dissipating substrate 100b, at least two conductive layers 103b separated from each other and disposed on the first insulating layer 102b, and a second insulating layer 104b with a plurality of pad openings 1040b and bare chip openings 1041b for covering the at least two conductive layers 103b. The positive pads Pb disposed on one of the conductive layers 103b and the negative pads Nb disposed on the other conductive layer 103b are respectively exposed by the pad openings 1040b of the second insulating layer 104b. In addition, each LED bare chip 20b is disposed in or above each bare chip opening 1041b and on one of the conductive layers 103b by an adhesive layer H.

Hence, the difference between the second embodiment and the first embodiment is that: in the second embodiment, each LED bare chip 20b is disposed on one of the conductive layers 103b by the adhesive layer H.

Third Embodiment

Figure 4:
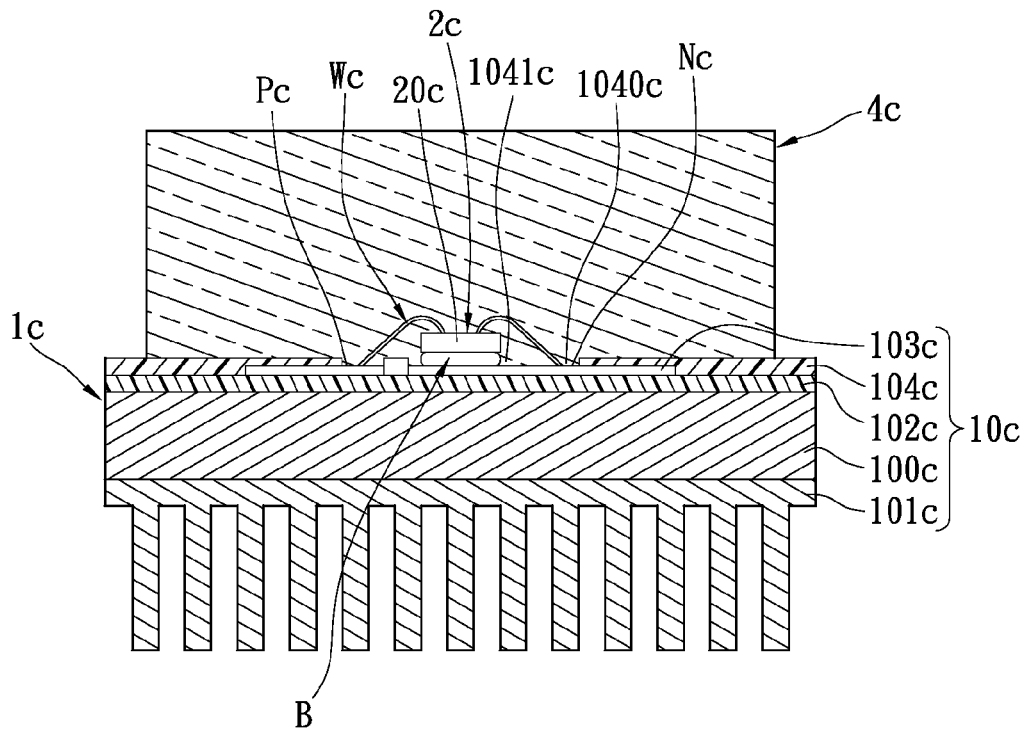
FIG. 4 is a cross-sectional, schematic view of the LED package structure according to the third embodiment of the instant disclosure.

Referring to FIG. 4, the third embodiment of the instant disclosure provides an LED package structure with standby bonding pads for increasing wire-bonding yield, including: a substrate unit 1c, a light-emitting unit 2c, a conductive wire unit Wc and a package unit 4c. Moreover, the substrate body 10c has a heat-dissipating substrate 100c, a heat sink 101c disposed on a bottom surface of the heat-dissipating substrate 100c, a first insulating layer 102c disposed on the top surface of the heat-dissipating substrate 100c, at least two conductive layers 103c separated from each other and disposed on the first insulating layer 102c, and a second insulating layer 104c with a plurality of pad openings 1040c and bare chip openings 1041c for covering the at least two conductive layers 103c. The positive pads Pc disposed on one of the conductive layers 103c and the negative pads Nc disposed on the other conductive layer 103c are respectively exposed by the pad openings 1040c of the second insulating layer 104c. In addition, each LED bare chip 20c is disposed in or above each bare chip opening 1041c and on one of the conductive layers 103c by solder balls B (or solder paste).

Hence, the difference between the third embodiment and the second embodiment is that: in the third embodiment, each LED bare chip 20c is disposed on one of the conductive layers 103c by the solder balls B (or solder paste).

Fifth Embodiment

Figure 5:
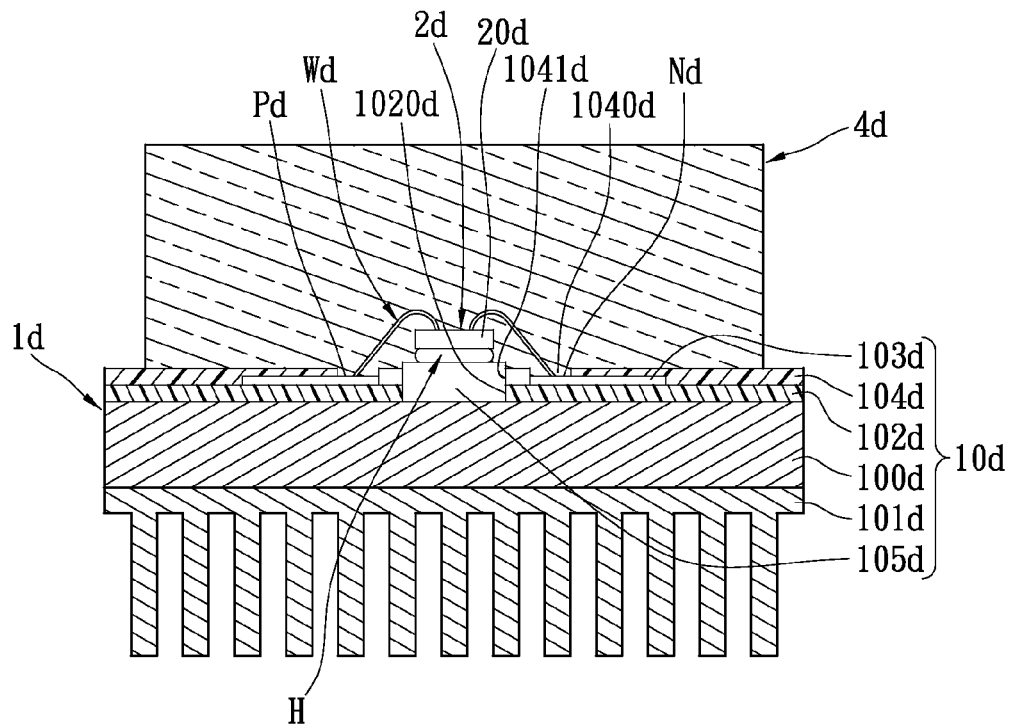
FIG. 5 is a cross-sectional, schematic view of the LED package structure according to the fourth embodiment of the instant disclosure.

Referring to FIG. 5, the fourth embodiment of the instant disclosure provides an LED package structure with standby bonding pads for increasing wire-bonding yield, including: a substrate unit 1d, a light-emitting unit 2d, a conductive wire unit Wd and a package unit 4d. Moreover, the substrate body 10d has a heat-dissipating substrate 100d, a heat sink 101d disposed on a bottom surface of the heat-dissipating substrate 100d, a first insulating layer 102d with a plurality of openings 1020d disposed on the top surface of the heat-dissipating substrate 100d, a plurality of heat-conducting blocks 105d respectively filled into the openings 1020d of the first insulating layer 102d and contacted with the heat-dissipating substrate 100d, at least two conductive layers 103d separated from each other and disposed on the first insulating layer 102d, and a second insulating layer 104d with a plurality of pad openings 1040d and bare chip openings 1041d for covering the at least two conductive layers 103d. The positive pads Pd disposed on one of the conductive layers 103d and the negative pads Nd disposed on the other conductive layer 103d are respectively exposed by the pad openings 1040d of the second insulating layer 104d, and each LED bare chip 20d is disposed in or above each bare chip opening 1041d and on each heat-conducting block 105d by an adhesive layer H.

Hence, the difference between the fourth embodiment and the above-mentioned embodiments is that: in the fourth embodiment, the first insulating layer 102d with the openings 1020d is disposed on the top surface of the heat-dissipating substrate 100d, the heat-conducting blocks 105d are respectively filled into the openings 1020d of the first insulating layer 102d and contacted with the heat-dissipating substrate 100d, and each LED bare chip 20d is disposed on each heat-conducting block 105d by the adhesive layer H.

Fifth Embodiment

Figure 6:
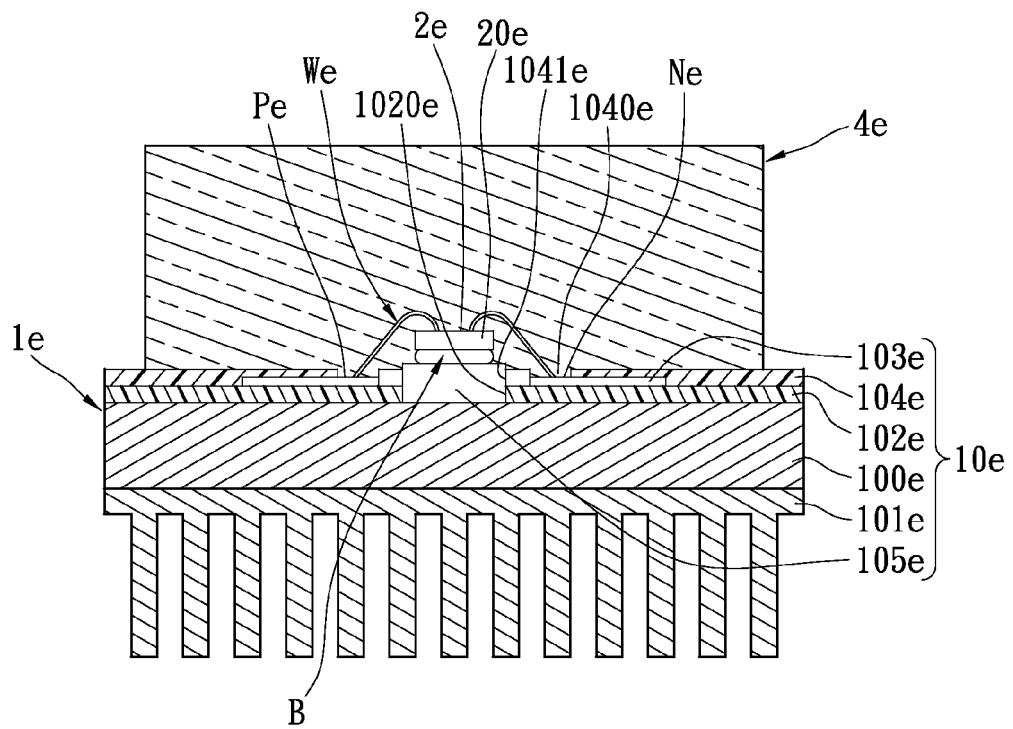
FIG. 6 is a cross-sectional, schematic view of the LED package structure according to the fifth embodiment of the instant disclosure.

Referring to FIG. 6, the fifth embodiment of the instant disclosure provides an LED package structure with standby bonding pads for increasing wire-bonding yield, including: a substrate unit 1e, a light-emitting unit 2e, a conductive wire unit We and a package unit 4e. Moreover, the substrate body 10e has a heat-dissipating substrate 100e, a heat sink 101e disposed on a bottom surface of the heat-dissipating substrate 100e, a first insulating layer 102e with a plurality of openings 1020e disposed on the top surface of the heat-dissipating substrate 100e, a plurality of heat-conducting blocks 105e respectively filled into the openings 1020e of the first insulating layer 102e and contacted with the heat-dissipating substrate 100e, at least two conductive layers 103e separated from each other and disposed on the first insulating layer 102e, and a second insulating layer 104e with a plurality of pad openings 1040e and bare chip openings 1041e for covering the at least two conductive layers 103e. The positive pads Pe disposed on one of the conductive layers 103e and the negative pads Ne disposed on the other conductive layer 103e are respectively exposed by the pad openings 1040e of the second insulating layer 104e, and each LED bare chip 20e is disposed in or above each bare chip opening 1041e and on each heat-conducting block 105e by solder balls B (or solder paste).

Hence, the difference between the fifth embodiment and the fourth embodiments is that: in the fifth embodiment, each LED bare chip 20e is disposed on each heat-conducting block 105e by the solder balls B (or solder paste).

Sixth Embodiment

Figure 7:
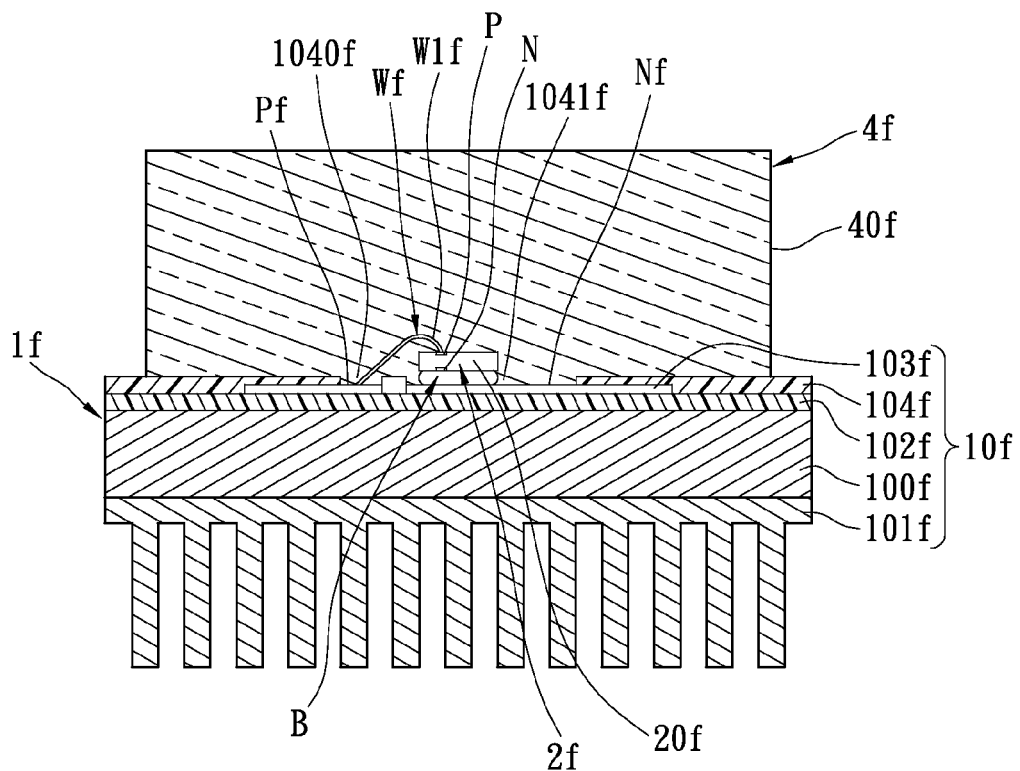
FIG. 7 is a cross-sectional, schematic view of the LED package structure according to the sixth embodiment of the instant disclosure.

Referring to FIG. 7, the sixth embodiment of the instant disclosure provides an LED package structure with standby bonding pads for increasing wire-bonding yield, including: a substrate unit 1f, a light-emitting unit 2f, a conductive wire unit Wf and a package unit 4f.

The substrate unit 1f has a substrate body 10f and a plurality of first pads Pf and second pads Nf disposed on the top surface of the substrate body 10f. The light-emitting unit 2f has a plurality of LED bare chips 20f electrically disposed on the top surface of the substrate body 10f. In addition, each LED bare chip 20f has two electrodes (P and N), one of the two electrodes (such as the electrode P) of each LED bare chip 20f corresponds to at least two of the first pads Pf, and another one of the two electrodes (such as the electrode N) of each LED bare chip 20f is electrically contacted with each second pad Nf.

Furthermore, the conductive wire unit Wf has a plurality of wires W1f. Each wire W1f is electrically connected between one of the two electrodes (such as the electrode P) of each LED bare chip 20a and one of the two first pads Pf. In addition, the package unit 4f has a light-permitting package resin body 40f disposed on the top surface of the substrate body 10f to cover the LED bare chips 20f.

Moreover, the substrate body 10f has a heat-dissipating substrate 100f, a heat sink 101f disposed on a bottom surface of the heat-dissipating substrate 100f, a first insulating layer 102f disposed on the top surface of the heat-dissipating substrate 100f, at least two conductive layers 103f separated from each other and disposed on the first insulating layer 102f, and a second insulating layer 104f with a plurality of pad openings 1040f and bare chip openings 1041f for covering the at least two conductive layers 103f. In addition, the first pads Pf disposed on one of the conductive layers 103f and the second pads Nf disposed on the other conductive layer 103f are respectively exposed by the pad openings 1040f of the second insulating layer 104f. Each LED bare chip 20f is disposed in or above each bare chip opening 1041f, and the LED bare chips 20f and the second pads Nf are disposed on the same conductive layer 103f by solder balls B (or solder paste).

Seventh Embodiment

Figure 8:
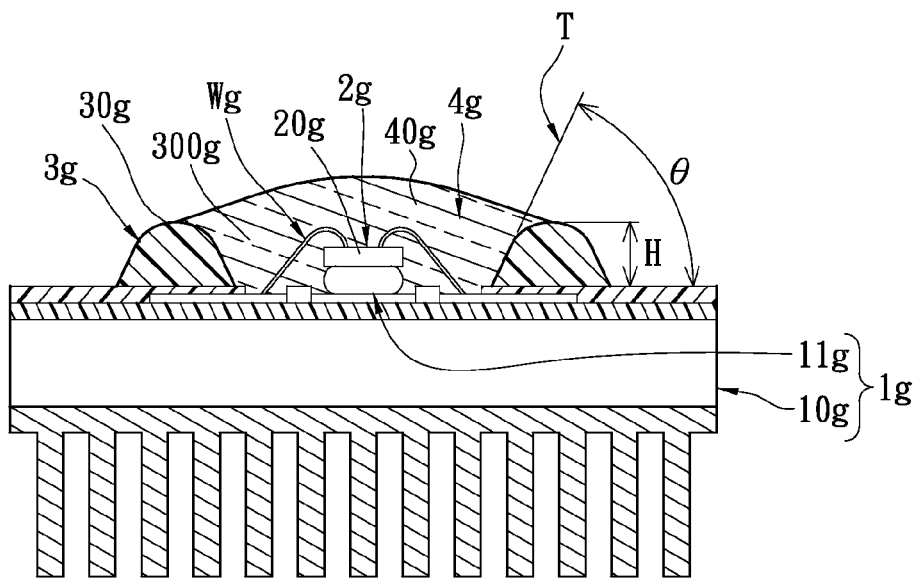
FIG. 8 is a cross-sectional, schematic view of the LED package structure according to the seventh embodiment of the instant disclosure.
Figure 9:
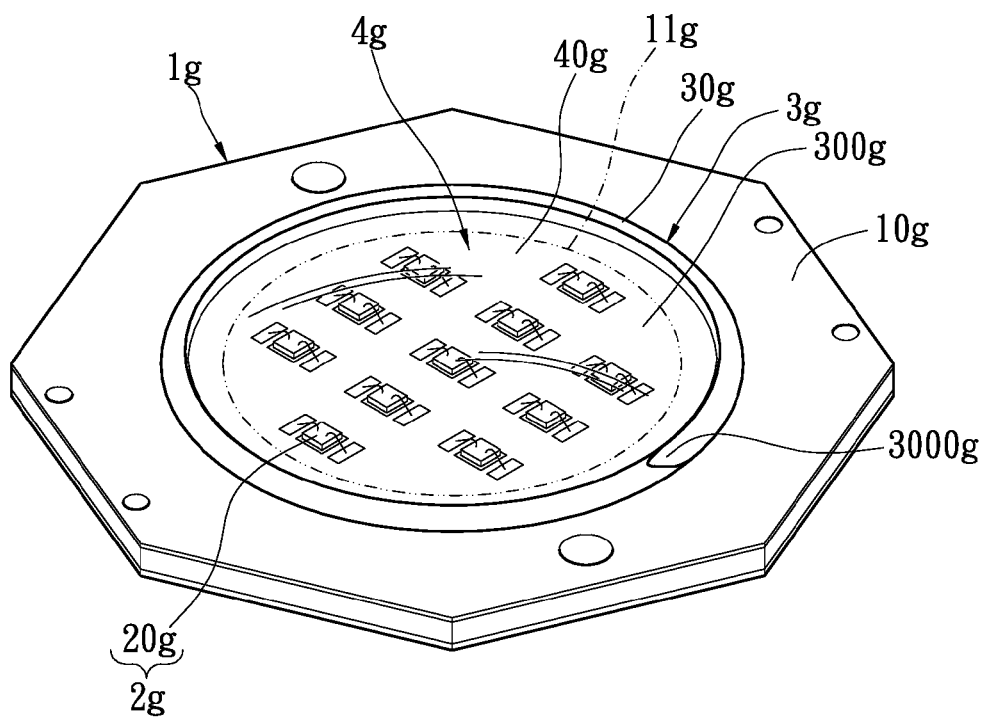
FIG. 9 is a perspective, schematic view of the LED package structure according to the seventh embodiment of the instant disclosure.

Referring to FIGS. 8 and 9, the seventh embodiment of the instant disclosure provides an LED package structure with standby bonding pads for increasing wire-bonding yield, including: a substrate unit 1g, a light-emitting unit 2g, a conductive wire unit Wg, a frame unit 3g and a package unit 4g.

The frame unit 3g has a continuous colloid frame 30g surroundingly formed on the top surface of the substrate body 10g by coating. The continuous colloid frame 30g surrounds the LED bare chips 20g to form a resin position limiting space 300g on the substrate body 10g. The substrate unit 1g has a bare chip-placing area 11g disposed on the top surface of the substrate body 10g, the LED bare chips 20g are disposed on the bare chip-placing area 11g, and the position of the light-permitting package resin body 40g is limited in the resin position limiting space 300g.

Moreover, the continuous colloid frame 30g has an arc shape formed on the top surface thereof. The continuous colloid frame 30g has a radius tangent T and the angle θ of the radius tangent T relative to the top surface of the substrate body 10g is between 40° C. and 50° C. The maximum height H of the continuous colloid frame 30g relative to the top surface of the substrate body 10g is between 0.3 mm and 0.7 mm. The width of a bottom side of the continuous colloid frame 30g is between 1.5 mm and 3 mm. The thixotropic index of the continuous colloid frame 30g is between 4 and 6, and the continuous colloid frame 30g can be a white thermo-hardening reflecting body mixed with inorganic additive.

Furthermore, the continuous colloid frame 30g has a convex or concave junction portion 3000g as shown in HU 9. In other words, when the continuous colloid frame 30g is going to finish by surroundingly coating, the convex or concave junction portion 3000g is formed naturally on the continuous colloid frame 30g. Hence, the convex or concave junction portion 3000g is created during surroundingly coating process. In general, the convex or concave junction portion 3000g may be formed at an intersection point of the start point and the terminal point of the continuous colloid frame 30g.

In conclusion, the positive electrode and the negative electrode of each LED bare chip respectively correspond to at least two of the positive pads and at least two of the negative pads, so that the positive electrode of each LED bare chip has at least one standby positive pad and the negative electrode of each LED bare chip has at least one standby negative pad.

Hence, when a first end of the wire does not correctly connect with first one of the at least two positive pads or the at least two negative pads (it means that the wire does not electrically connect with the first one of the at least two positive pads or the at least two negative pads (such as floating solder)), the manufacturer can make the same first end of the wire connect to another one of the at least two positive pads or the at least two negative pads without cleaning solder splash on the surface of the first one of the at least two positive pads or the at least two negative pads, in order to decrease wire-bonding time (increase wire-bonding efficiency) and increase wire-bonding yield.

The above-mentioned descriptions merely represent the preferred embodiments of the instant disclosure, without any intention or ability to limit the scope of the instant disclosure which is fully described only within the following claims. Various equivalent changes, alterations or modifications based on the claims of instant disclosure are all, consequently, viewed as being embraced by the scope of the instant disclosure.

What is claimed is:

1. An LED package structure, comprising:
a substrate unit having a substrate body and a plurality of positive pads and negative pads disposed on the top surface of the substrate body;
a light-emitting unit having a plurality of LED bare chips electrically disposed on the top surface of the substrate body, wherein each LED bare chip has a positive electrode and a negative electrode, the positive electrode of each LED bare chip corresponds to at least two of the positive pads, and the negative electrode of each LED bare chip corresponds to at least two of the negative pads;
a conductive wire unit having a plurality of wires, wherein each wire is electrically connected between the positive electrode of the LED bare chip and one of the at least two positive pads or between the negative electrode of the LED bare chip and one of the at least two negative pads;
a package unit having a light-permitting package resin body disposed on the top surface of the substrate body to cover the LED bare chips; and
a frame unit having a continuous colloid frame surroundingly formed on the top surface of the substrate body by coating, wherein the continuous colloid frame surrounds the LED bare chips to form a resin position limiting space on the substrate body;
wherein the continuous colloid frame is extended from an initial point to a terminal point, both the initial point and the terminal point are substantially the same position, thus two end portions of the continuous colloid frame are substantially overlapping to form a convex dot on the terminal point.

2. The LED package structure according to claim 1, wherein the substrate unit has a bare chip-placing area disposed on the top surface of the substrate body, the LED bare chips are disposed on the bare chip-placing area, and the position of the light-permitting package resin body is limited in the resin position limiting space.

3. The LED package structure according to claim 1, wherein the continuous colloid frame has an arc shape formed on the top surface thereof, the continuous colloid frame has a radius tangent and the angle of the radius tangent relative to the top surface of the substrate body is between 40° and 50°, the maximum height of the continuous colloid frame relative to the top surface of the substrate body is between 0.3 mm and 0.7 mm, and the width of a bottom side of the continuous colloid frame is between 1.5 mm and 3 mm.

4. The LED package structure according to claim 1, wherein the thixotropic index of the continuous colloid frame is between 4 and 6, and the continuous colloid frame is a white thermohardening reflecting body mixed with inorganic additive.

5. An LED package structure, comprising:
a substrate unit having a substrate body and a plurality of first pads and second pads disposed on the top surface of the substrate body;
a light-emitting unit having a plurality of LED bare chips electrically disposed on the top surface of the substrate body, wherein each LED bare chip has two electrodes, one of the two electrodes of each LED bare chip corresponds to at least two of the first pads, and the other electrode of each LED bare chip electrically contacts each second pad;
a conductive wire unit having a plurality of wires, wherein each wire is electrically connected between one of the two electrodes of the LED bare chip and one of the two first pads;
a package unit having a light-permitting package resin body disposed on the top surface of the substrate body to cover the LED bare chips; and
a frame unit having a continuous colloid frame surroundingly formed on the top surface of the substrate body by coating, wherein the continuous colloid frame surrounds the LED bare chips to form a resin position limiting space on the substrate body;
wherein the continuous colloid frame is extended from an initial point to a terminal point, both the initial point and the terminal point are substantially the same position, thus two end portions of the continuous colloid frame are substantially overlapping to form a convex dot on the terminal point.

6. An LED package structure, comprising:
a substrate unit having a substrate body and a plurality of first pads and second pads disposed on the top surface of the substrate body;
a light-emitting unit having a plurality of LED bare chips electrically disposed on the top surface of the substrate body, wherein each LED bare chip has two electrodes, one of the two electrodes of each LED bare chip corresponds to at least two of the first pads, and the other electrode of each LED bare chip electrically contacts each second pad;
a conductive wire unit having a plurality of wires, wherein each wire is electrically connected between one of the two electrodes of the LED bare chip and one of the two first pads;
a package unit having a light-permitting package resin body disposed on the top surface of the substrate body to cover the LED bare chips; and
a frame unit having a continuous colloid frame surroundingly formed on the top surface of the substrate body by coating, wherein the continuous colloid frame surrounds the LED bare chips to form a resin position limiting space on the substrate body;

wherein the continuous colloid frame is extended from an initial point to a terminal point to form a concave junction portion between the initial point and the terminal point.

* * * * *